(12) United States Patent
Matsuoka et al.

(10) Patent No.: US 6,809,364 B2
(45) Date of Patent: Oct. 26, 2004

(54) SEMICONDUCTOR INTEGRATED CIRCUIT DEVICE AND A METHOD OF MANUFACTURE THEREOF

(75) Inventors: Hideyuki Matsuoka, Hoya (JP); Satoru Yamada, Ome (JP); Isamu Asano, Iruma (JP); Ryo Nagai, Mizuho (JP); Tomonori Sekiguchi, Kokubunji (JP); Riichiro Takemura, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/630,695

(22) Filed: Jul. 31, 2003

(65) Prior Publication Data

US 2004/0021159 A1 Feb. 5, 2004

Related U.S. Application Data

(62) Division of application No. 09/592,648, filed on Jun. 13, 2000, now Pat. No. 6,621,110.

(30) Foreign Application Priority Data

Jun. 14, 1999 (JP) ............................................ 11-166320

(51) Int. Cl.⁷ ...................... H01L 27/108; H01L 29/76; H01L 29/94; H01L 31/119
(52) U.S. Cl. ...................... 257/296; 257/303; 257/304; 257/305; 257/306; 257/307; 257/308; 257/309
(58) Field of Search .......................... 257/296, 303–309

(56) References Cited

U.S. PATENT DOCUMENTS 6,100,117 A   8/2000  Hao et al.
6,130,449 A  10/2000  Matsuoka et al.

FOREIGN PATENT DOCUMENTS

JP           07-066299          3/1995

OTHER PUBLICATIONS

Ahn et al "Bidirectional Matched Global Bit Line Scheme for High Density DRAMs", Symposium on VLSI Circuits, 1993, pp. 91–92.

*Primary Examiner*—Thien F Tran
(74) *Attorney, Agent, or Firm*—Mattingly, Stanger & Malur, P.C.

(57) ABSTRACT

A DRAM of an open bit line structure has a cell area smaller than that of a DRAM of a folded bit line structure and is susceptible to noise. A conventional DRAM of an open bit line structure has a large bit line capacitance and is susceptible to noise or has a large cell area. There has been no DRAM of an open bit line structure having a small bit line capacitance, unsusceptible to noise and having a small cell area. The present invention forms capacitor lower electrode plug holes not aligned with bit lines to reduce bit line capacitance. Bit lines are formed in a small width, capacitor lower electrode plugs are dislocated from positions corresponding to the centers of the bit lines in directions away from the bit lines and the contacts are formed in a reduced diameter to avoid increasing the cell area. Thus a semiconductor storage device of an open bit line structure resistant to noise and having a small cell area is provided.

6 Claims, 19 Drawing Sheets

SENSE AMP. PITCH=8F

SENSE AMP. PITCH=6F

▨ FG
☐ L
▧ M1
☐ CONT

SEMICONDUCTOR INTEGRATED CIRCUIT DEVICE AND A METHOD OF MANUFACTURE THEREOF

This is a divisional application U.S. Ser. No. 09/592,648, filed Jun. 13, 2000 now U.S. Pat. No. 6,621,110.

BACKGROUND OF THE INVENTION

1. Field of the Invention

The present invention relates to a small semiconductor integrated circuit device having a large storage capacity. More particularly, the present invention relates to a dynamic random-access memory (hereinafter, abbreviated to "DRAM") suitable for use in a high-degree integrated circuit device.

2. Description of the Related Arts

The degree of integration of DRAMs has been quadrupled in three years and demand for DRAMs has progressively increased owing to the recent booming demand for personal computers.

Memory cells of a DRAM are arranged in either a folded bit line arrangement or an open bit line arrangement. FIG. 1 shows the typical layout of the memory cells of a DRAM of a typical folded bit line structure. In this DRAM, word lines and bit lines of a width F are arranged at pitches 2F to arrange the memory cells in the least possible area. Two memory cells are formed in a laterally. elongate active region, and the two memory cells use a common longitudinally elongate bit line contact. FIG. 2 shows the typical layout of the memory cells of a DRAM of a typical open bit line structure mentioned in "1993 Symposium on VLSI Circuits" p. 91. In this DRAM, word lines of a width F are arranged at pitches 2f, and bit lines of a width F are arranged at pitches 3F. Let us examine a data read process of reading data from those DRAMs of two different bit line structures. When one of the word lines of the DRAM in the folded bit line structure is turned on, data can be read from the alternate bit lines. As shown in FIG. 3(a), two paired bit lines connected to a sense amplifier are two adjacent bit lines in the same mat. Thus, the arrangement of the memory cells is called a folded bit line structure. When one of the word lines of the DRAM of the open bit line structure is turned on, data can be read from all the bit lines, and two paired bit lines are in different mats as shown in FIG. 3(b). Whereas the driven word line coupled with the paired bit lines is common in the folded bit line structure, the same is not common in the open bit line structure. In terms of noise, word line driving noise is cancelled between the paired bit lines in the folded bit line structure and the same is not cancelled in the open bit line structure, which signifies that the folded bit line structure is unsusceptible to noise. Although the open bit line structure is susceptible to noise, it is a significant feature of the open bit line structure that the cells can be arranged in a small area. Whereas one cell needs an area of 8 $F^2$ in the folded bit line structure as shown in FIG. 1, one cell needs an area of 6 $F^2$ in the open bit line structure as shown in FIG. 2.

In view of mass production, the reduction of the area of a chip, i.e., the reduction of the area of a region for memory cell arrangement, is very effective in reducing the cost of the product. From such a point of view, the open bit line structure is more desirable than the folded bit line structure. However, it is a problem in employing the open bit line structure how far the noise resistance of the open bit line structure can be improved. Practically, the open bit line structure has been employed in DRAMs of generations up to a 16 kB-generation. However, recent DRAMs of advanced generations employ the folded bit line structure.

A DRAM having memory cells arranged in the open bit line arrangement of a structure similar to that shown in FIG. 2 is proposed in Japanese Patent Laid-Open No. Hei 07-066299. Although this prior art DRAM has a memory cell typical layout closely resembling the memory cell typical layout shown in FIG. 2, the bit lines of this DRAM are arranged at pitches 4F. Thus, the lower electrode contact holes for capacitors are arranged at increased intervals to reduce current leakage across the memory cells.

The following problems reside in the foregoing prior art DRAMs.

The DRAM mentioned in "1993 Symposium on VLSI Circuits" has the following problems. As obvious from FIG. 2, the lower electrode contact holes 5 for the capacitors are close to the bit lines 3. The so-called self-alignment techniques are essential to forming the lower electrode contact holes 5 for the capacitors so that the lower electrode contact holes 5 may not touch the bit lines 3. A bit line forming process and those following the bit line forming process will be explained with reference to a section taken on line A—A in FIG. 2. As shown in FIG. 4, bit line contact plugs 10 are formed and then a two-layer film of a tungsten film and a silicon nitride film for forming bit lines are deposited. The two-layer film is processed by a lithographic process and a dry etching process to form bit lines 11 as shown in FIG. 5. A silicon nitride film 1201 is deposited as shown in FIG. 6, and a layer insulating film 901 of silicon oxide is formed in a flat surface over the silicon nitride film 1201. Lower electrode contact holes for the capacitors are formed by an etching process having a high silicon nitride selectivity. Then, plugs 13 are formed as shown in FIG. 7. Thus, the lower electrode contact holes can be formed by a self-alignment contact hole forming technique so that the lower electrode contact do not touch the bit lines 11. Even if a sufficient allowance is unavailable, the contact holes can be formed without increasing area by the self-alignment contact hole forming technique. However, the self-alignment contact hole forming technique has the following problems. The dielectric constant of silicon nitride is about twice that of silicon oxide. The self-alignment contact hole forming technique shown in FIG. 7 surrounds the bit line 11 by silicon nitride 12 and 1201 and insulate the bit line 11 from the lower electrode plug by silicon nitride, which increases bit line capacitance. As mentioned above, the open bit line structure is more susceptible to noise than the folded bit line structure. Therefore, it is very important to reduce bit line capacitance when the open bit line structure is employed. Therefore, it is inappropriate to apply the self-alignment contact hole forming technique to fabricating a DRAM of the open bit line structure.

In the DRAM proposed in Japanese Patent Laid-Open No. Hei 07-066299, the memory cells are arranged in the open bit line arrangement similar to that shown in FIG. 2 and the bit lines are arranged at increased pitches to space the lower electrode contact holes for capacitors wide apart. Therefore, the memory cell area increases and the DRAM is unable to make the most of the characteristic advantage of the open bit line arrangement.

SUMMARY OF THE INVENTION

The present invention has been made in view of those problems in the prior art and it is therefore an object of the present invention to provide a semiconductor integrated circuit device having a small bit line capacitance, excellent in noise resistance, requiring a small cell area and having bit lines arranged in an open bit line arrangement, and to provide a method of fabricating such a semiconductor integrated circuit device.

Typical summaries of the invention is disclosed in this application will be described as follows.

According to a first aspect of the present invention, a semiconductor integrated circuit device having a plurality of word lines extending in a first direction, a plurality of bit lines extending in a second direction intersecting the first direction, and a plurality of memory cells each having a transistor and a capacitor placed on the bit line comprises: active regions formed in a surface of a semiconductor substrate, intersecting adjacent first and second word lines among the plurality of word lines and first bit lines among the plurality of bit lines, extending in a third direction different from the first and the second direction and having a predetermined width along a fourth direction perpendicular to the third direction; first and second semiconductor regions formed in the active regions and serving as sources and drains of the transistors; a first electrode(capacitor lower electrode) and a second electrode(plate) for the capacitors; a dielectric film formed between the first and the second electrodes of the capacitors; a first insulating film formed between the bit lines and the first electrodes(capacitor lower electrode); and a first conducting layer(SNCT) having portions formed in first openings formed in the first insulating film and electrically connecting the first(source) or the second semiconductor regions(drain) to the first electrodes serving as the lower electrodes of the capacitors; wherein portions of the first conducting layer are arranged in regions surrounded by the word lines and the bit lines, respectively, and the centers of the portions of the first conducting layers(SNCT) are dislocated from positions on the center lines of the active regions extending in the third direction.

According to a second aspect of the present invention, a semiconductor integrated circuit device comprises: adjacent first and second word lines extending in a first direction; third word lines disposed adjacent to the first word lines opposite to the second word lines with respect to the first word lines; fourth word lines disposed adjacent to the second word lines opposite to the first word lines with respect to the second word lines; adjacent first, second and third bit lines extending in a second direction intersecting the first direction; active regions extending in a third direction intersecting the first and the second direction; first semiconductor regions formed in the active regions between the first and the second word lines; second semiconductor regions formed in the active regions between the first and the third word lines and between the second and the fourth word lines; first and second electrodes for forming capacitors; a dielectric film formed between the first and the second electrodes; and a plurality of first conducting layers having portions electrically connecting the second semiconductor regions to the first electrodes; wherein the portions of the first conducting layers are formed in regions surrounded by the word lines and the bit lines, respectively, an angle between a straight line connecting the center of each portion of the first conducting layer disposed between the first and the third word lines to the center of each portion of the first conducting layer disposed between the second and the fourth word lines and the first direction is smaller than an angle between the third direction and the first direction.

According to a third aspect of the present invention, a semiconductor integrated circuit device having a plurality of word lines extending in a first direction, a plurality of bit lines extending in a second direction intersecting the first direction, and a plurality of memory cells each including a transistor and a capacitor disposed on the bit line comprises: active regions formed on a semiconductor substrate, extending in a third direction different from the first and the second directions and each intersecting the two word lines and the one bit line; first and second semiconductor regions formed in the active regions and serving as sources and drains of the transistors; first and second electrodes for forming the capacitors; a dielectric film formed between the first and the second electrodes; a first insulating film formed between the bit lines and the first electrodes; and a first conducting layer having portions formed in first openings formed in the first insulating film and electrically connecting either of the first and the second semiconductor regions to the first electrodes; wherein portions of the first conducting layer are arranged in regions surrounded by the word lines and the bit lines, respectively, and the portions of the first conducting layer has a width in the second direction smaller than that of the word lines.

According to a fourth aspect of the present invention, a semiconductor integrated circuit device having a plurality of word lines extending in a first direction, a plurality of bit lines extending in a second direction intersecting the first direction, and a plurality of memory cells each including a transistor and a capacitor disposed on the bit line comprises: first and second electrodes for forming the capacitors formed on a semiconductor substrate; a dielectric film formed between the first and the second electrodes; a first insulating film formed between the bit lines and the first electrodes; and a first conducting layer having portions formed in first openings formed in the first insulating film and electrically connecting the transistors to the first electrodes; wherein portions of the first conducting layers are arranged in regions surrounded by the word lines and the bit lines, respectively, and the bit lines have a width smaller than that of the word lines.

According to a fifth aspect of the present invention, a semiconductor integrated circuit device fabricating method comprises the steps of: adjacently forming first, second and third conducting layers on a semiconductor substrate; forming a first insulating film over the upper surfaces and the side walls of the first, the second and the third conducting layers; forming a second insulating film over the first insulating film so as to fill up gaps between the first, the second and the third conducting layers; forming first openings in the first and the second insulating film so that portions of the surface of the semiconductor substrate between the first and the second conducting layers are exposed; forming a fourth conducting layer so as to fill up the first openings; forming second openings in the first and the second insulating films so that portions of the surface of the semiconductor substrate between the second and the third conducting layer are exposed; and forming a fifth conducting layer so as to fill up the second openings.

According to a sixth aspect of the present invention, a semiconductor integrated circuit device fabricating method comprises the steps of: forming first and second conducting layers in a memory cell forming regions on a semiconductor substrate and forming a third conducting layer in a peripheral circuit forming region on the semiconductor substrate; forming a first insulating film over the first, the second and the third conducting layers in a thickness such that a gap between the first and the second conducting layers is not filled up; forming a second insulating film over the first, the second and the third conducting layer in a thickness such that the gap between the first and the second conducting layers is filled up; forming a third insulating film over the memory cell forming region; and forming a side wall insulating film over the side walls of the third conducting layer by subjecting portions of the first and the second insulating films formed over the third conducting layer to anisotropic etching.

The semiconductor integrated circuit device having the foregoing construction and formed by the foregoing method has a small bit line capacity, is excellent in noise resistance and has a small cell area.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

First Embodiment

Figure 1:
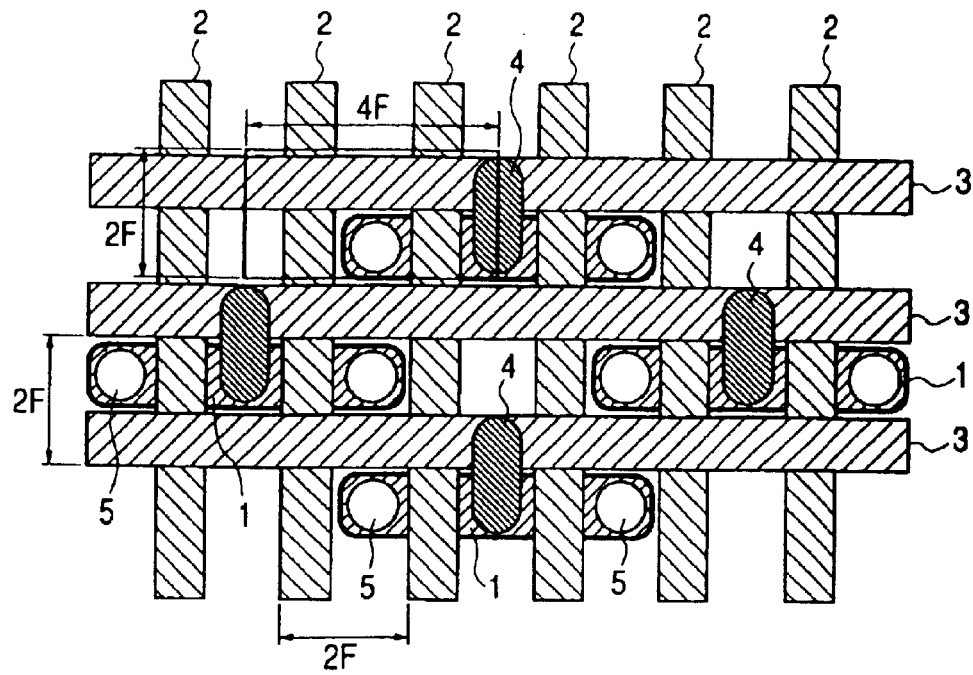
FIG. 1 is a typical layout of the memory cells of a conventional DRAM having a folded bit line structure.
Figure 2:
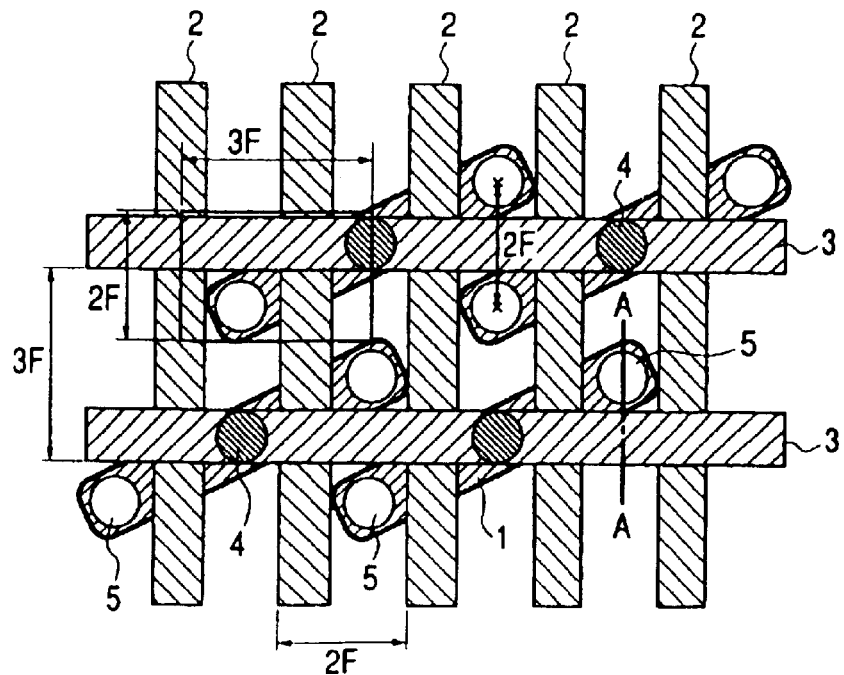
FIG. 2 is a typical layout of the memory cells of a conventional DRAM having an open bit line structure.
Figure 3A:
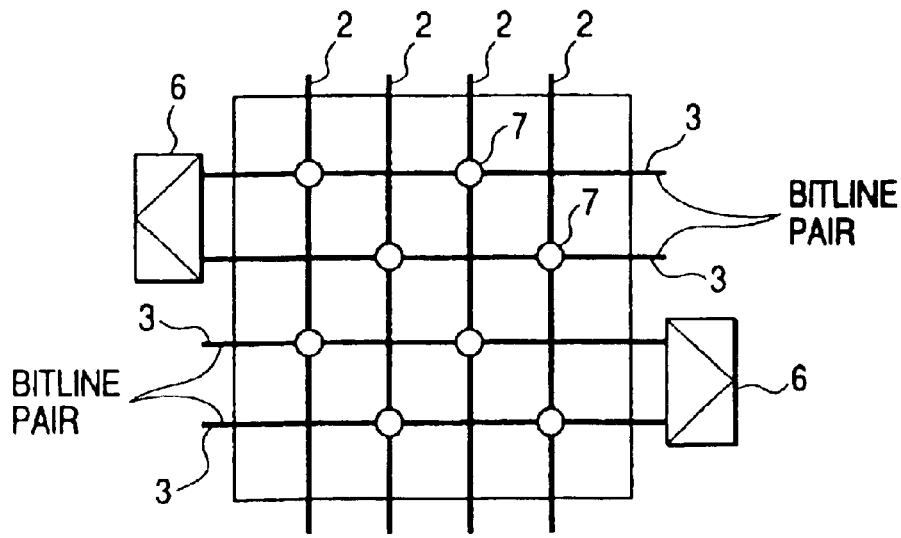
FIGS. 3(a) and 3(b) are diagrammatic views of assistance in explaining the principles of a folded bit line structure and an open bit line structure, respectively.
Figure 3B:
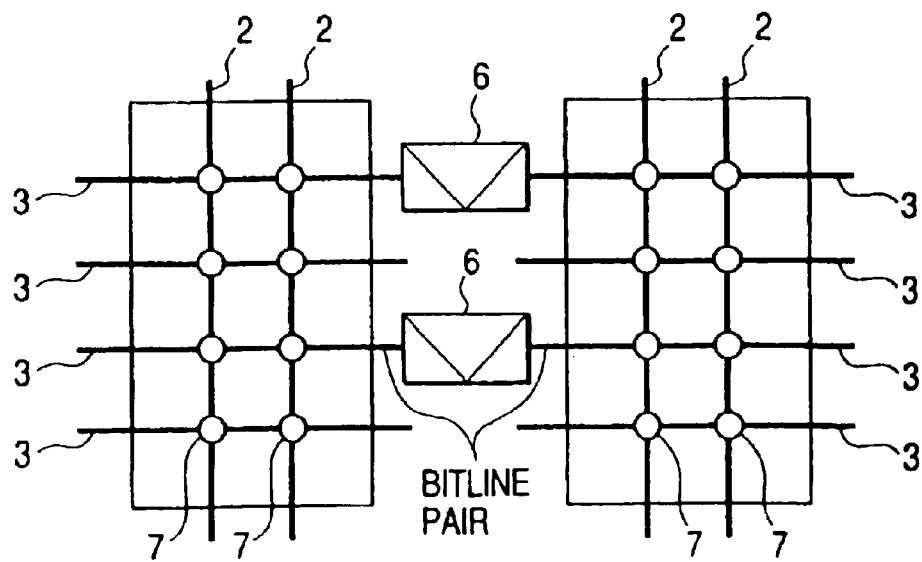
Figure 4:
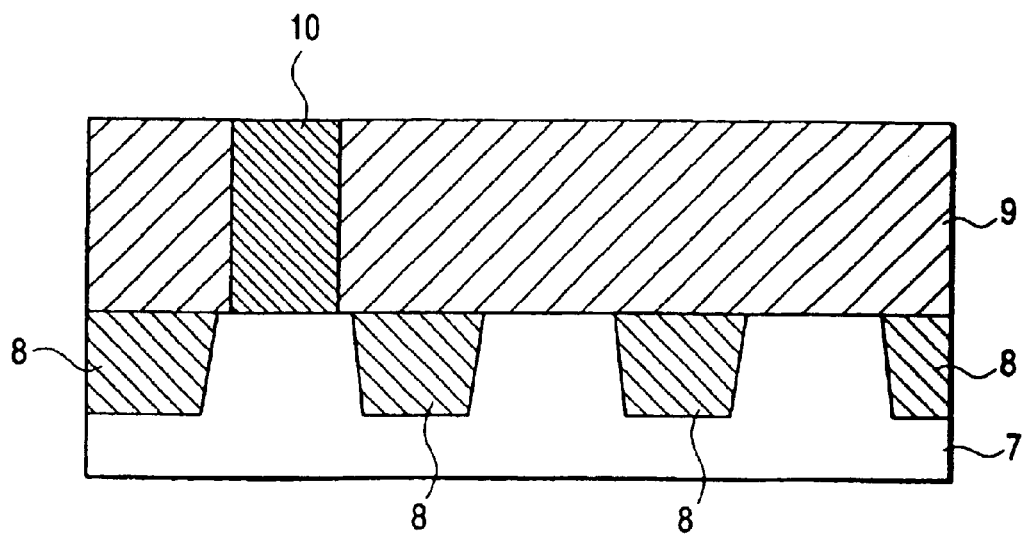
FIG. 4 is a view of assistance in explaining a self-alignment contact hole forming process.
Figure 5:
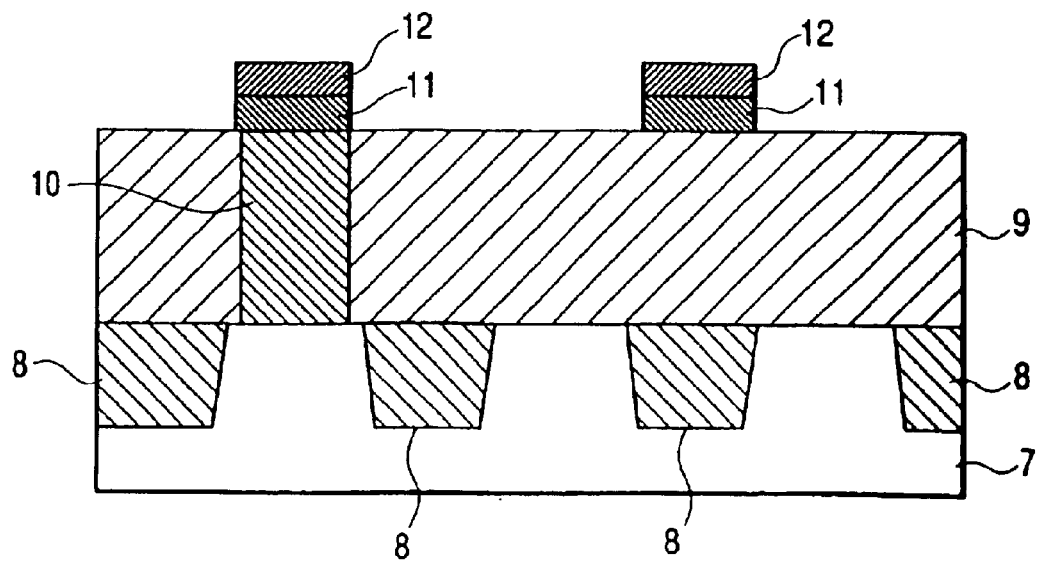
FIG. 5 is a view of assistance in explaining a self-alignment contact hole forming process.
Figure 6:
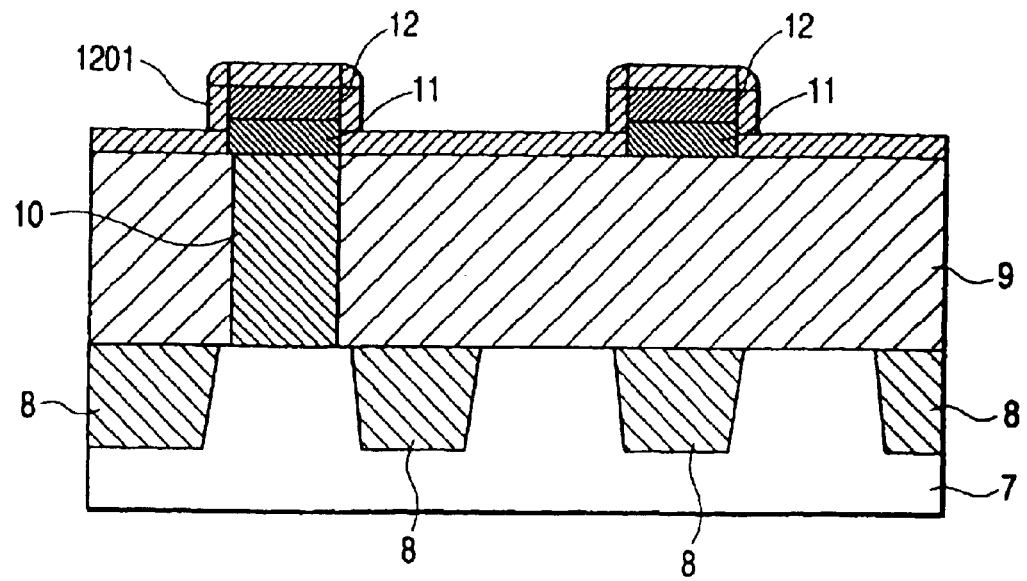
FIG. 6 is a view of assistance in explaining a self-alignment contact hole forming process.
Figure 7:
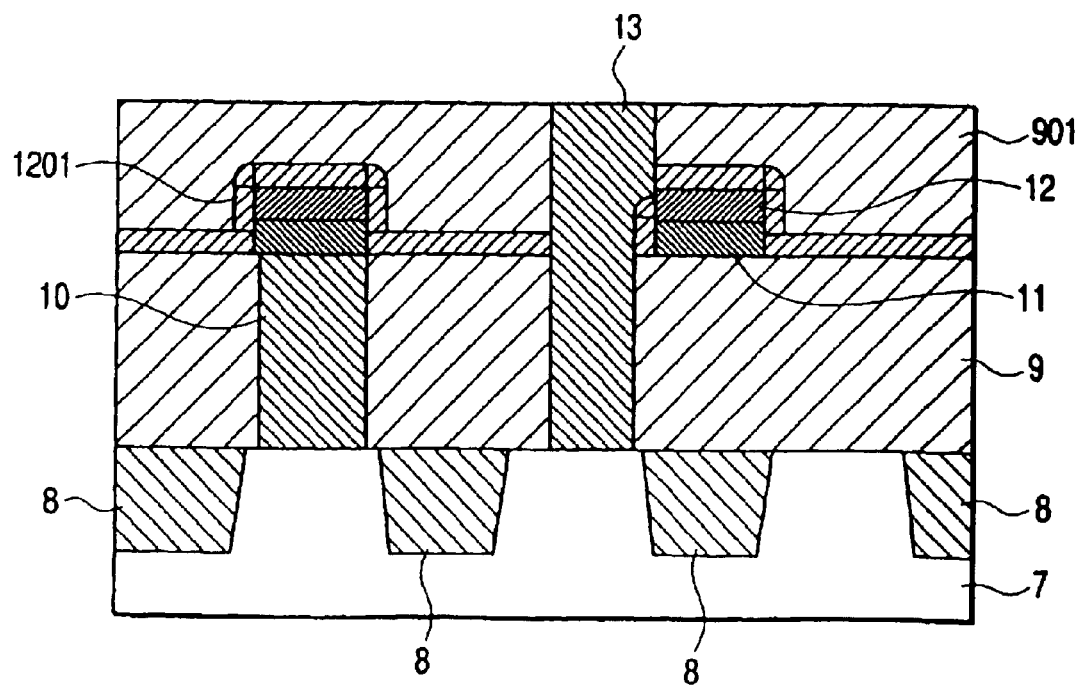
FIG. 7 is a view of assistance in explaining a self-alignment contact hole forming process.
Figure 8:
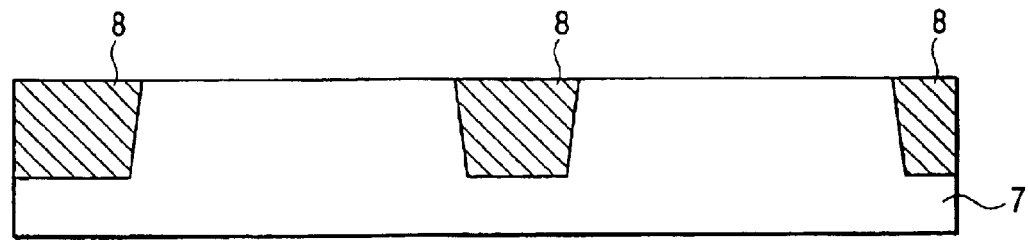
FIG. 8 is a typical sectional view of a workpiece in one phase of a semiconductor storage device fabricating method according to the present invention.
Figure 9:
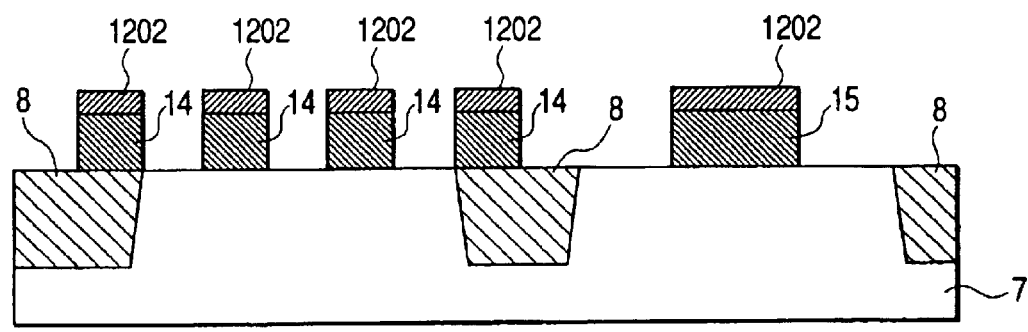
FIG. 9 is a typical sectional view of the workpiece in one phase of the semiconductor storage device fabricating method according to the present invention.
Figure 10:
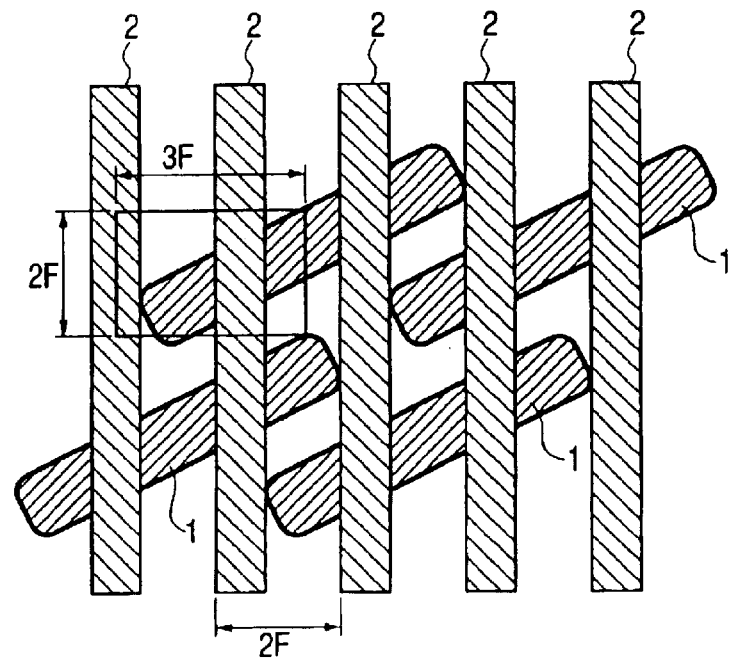
FIG. 10 is a typical layout of the components of the semiconductor storage device in one phase of the semiconductor storage device fabricating method according to the present invention.
Figure 11:
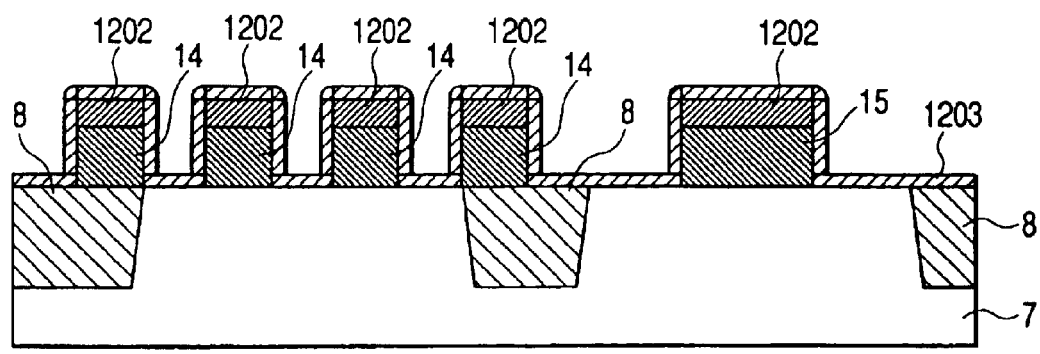
FIG. 11 is a typical sectional view of the workpiece in one phase of the semiconductor storage device fabricating method according to the present invention.

Referring to FIG. 8, shallow element isolation regions 8 are formed in a surface of a semiconductor substrate 7. Impurity ions are implanted in the surface of the semiconductor substrate 7 to form wells and punch-through stopper regions and a gate-oxide film is formed. Then, a 50 nm thick nondoped polysilicon film is deposited on the semiconductor substrate 7 by a known CVD method (chemical vapor deposition method). For forming a dual gate electrode, Phosphorus ions are implanted in n-type gate regions in a dose of $2^{15}$ cm$^{-2}$ at energy of 5 keV. Boron ions are implanted in p-type gate regions in a dose of $2^{15}$ cm$^{-2}$ at energy of 2 keV. Arsenic may be used instead of phosphorus, and BF$_2$ may be used instead of boron. Subsequently, a 10 nm thick TiN film and a 80 nm thick W film are formed by sputtering to form word lines having a low resistance. The TiN film suppresses the formation of a silicide by reaction between polysilicon and tungsten. A WN film may be used instead of the TiN film. A 100 nm thick SiN film for forming self-alignment contacts by a CVD method. The SiN film, the W film, the TiN film and the polysilicon film are processed by a known dry etching method to form gate electrodes 14. Thus, a workpiece as shown in FIG. 9 is obtained. Word lines 2 are arranged as shown in FIG. 10. Arsenic ions are implanted in regions for forming a diffused layer for n-type MOSFETs in a dose of $1^{14}$ cm$^{-2}$ at energy of 20 keV and BF$_2$ ions are implanted in regions for forming a diffused layer for p-type MOSFETs in a dose of $1^{14}$ cm$^2$ at energy of 20 keV by using resist masks. A 30 nm thick SiN film 1203 is deposited by a CVD method as shown in FIG. 11. Then, portions of the SiN film in peripheral circuit regions are etched back to form a gate side wall film, and an ion implantation process using a resist mask is carried out to reduce the resistance of a diffused layer. A resist film having openings corresponding to p-type diffused regions is formed and BF$_2$ ions are implanted in the regions in a dose of $2^{15}$ cm$^{-2}$ at energy of 20 keV. The resist film is removed, a resist film having openings corresponding to n-type diffused regions is formed and As ions are implanted in the regions in a dose of $2^{15}$ cm$^{-2}$ at energy of 15 keV.

Figure 12:
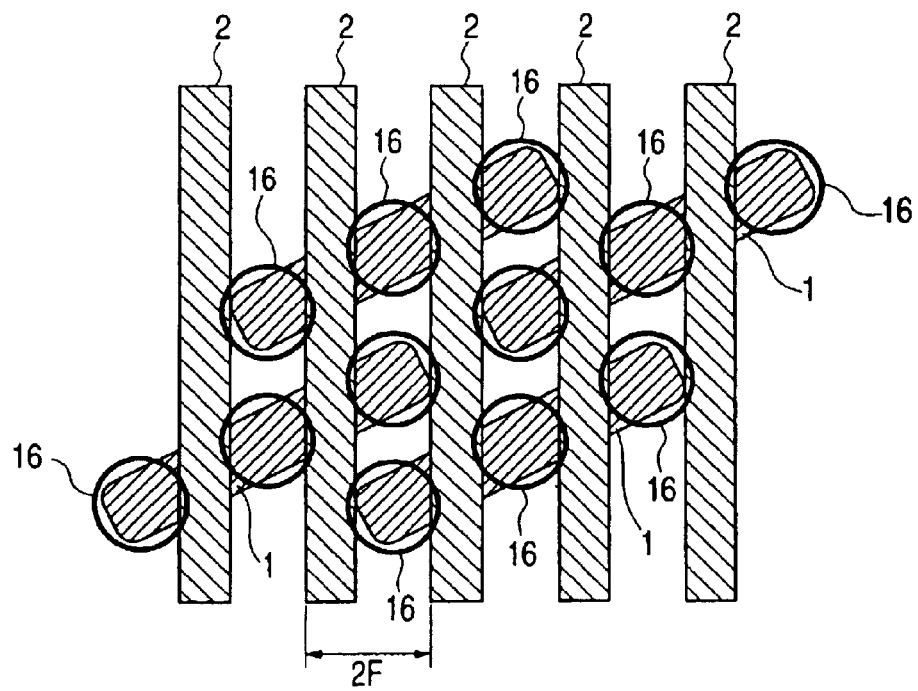
FIG. 12 is a typical layout of the components of the semiconductor storage device in one phase of the semiconductor storage device fabricating method according to the present invention.
Figure 13:
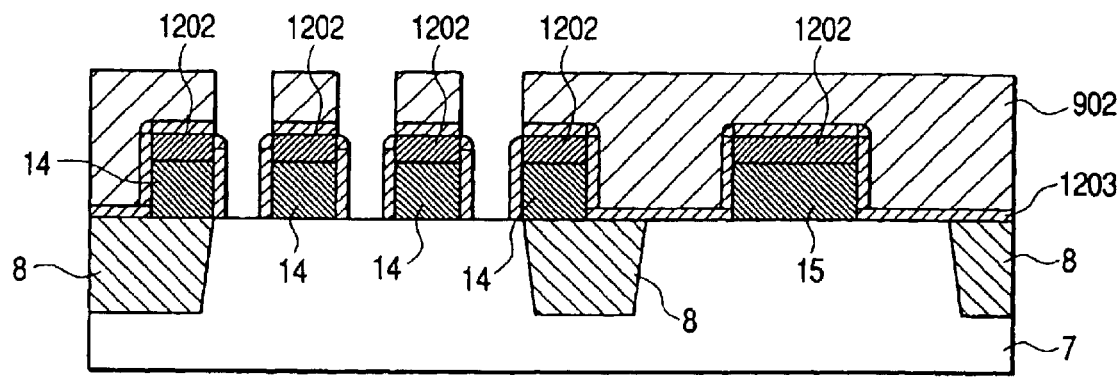
FIG. 13 is a typical sectional view of the workpiece in one phase of the semiconductor storage device fabricating method according to the present invention.
Figure 14:
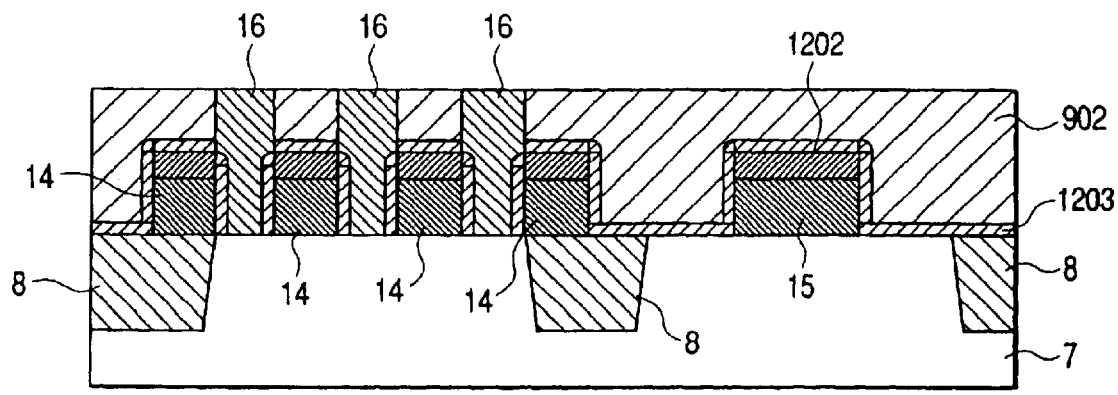
FIG. 14 is a typical sectional view of the workpiece in one phase of the semiconductor storage device fabricating method according to the present invention.

A 350 nm thick oxide film is deposited by a CVD method and the surface of the oxide film is planarized. Plug holes of about 0.2 μm in diameter for bit lines and capacitor electrodes are formed in a region of the oxide film corresponding to a memory array to expose the surface of the SiN film in the plug holes. Since gate electrodes are covered completely with the SiN film, the gate electrodes are not exposed during the process for processing the oxide film. FIG. 12 shows the layout of lower electrode contact plugs 16 at this stage. Subsequently, a 30 nm thick SiN film is subjected to dry etching to expose the surface of the diffused layer formed in the semiconductor substrate as shown in FIG. 13. Then, phosphorus is implanted in a dose of $6^{12}$ cm$^{-2}$ at energy of 25 keV to moderate the field of memory cell transistors. A 500 nm thick polysilicon film for forming memory cell plugs is deposited. The polysilicon film is doped in an impurity concentration of $4^{20}$ cm$^{-3}$ of phosphorus. The polysilicon film is planarized and lower electrode contact plugs 16 for the lower electrodes of memory cells as shown in FIG. 14.

Figure 15:
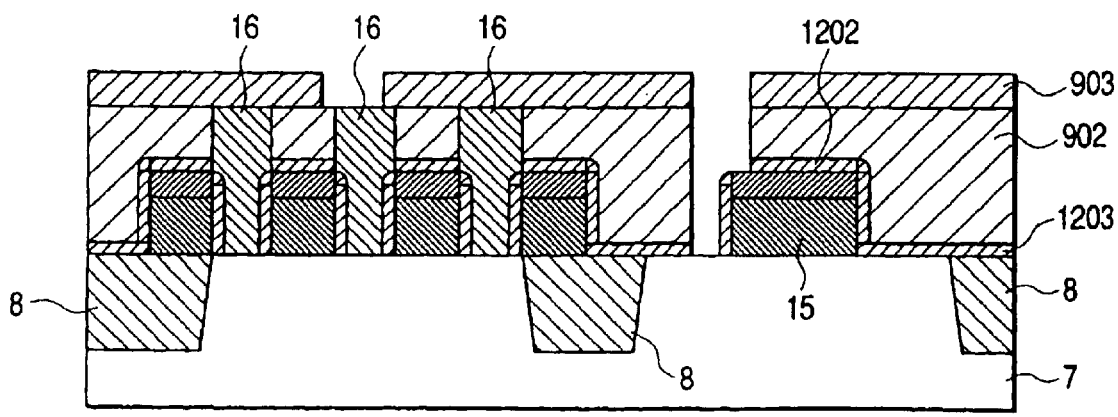
FIG. 15 is a typical sectional view of the workpiece in one phase of the semiconductor storage device fabricating method according to the present invention.
Figure 16:
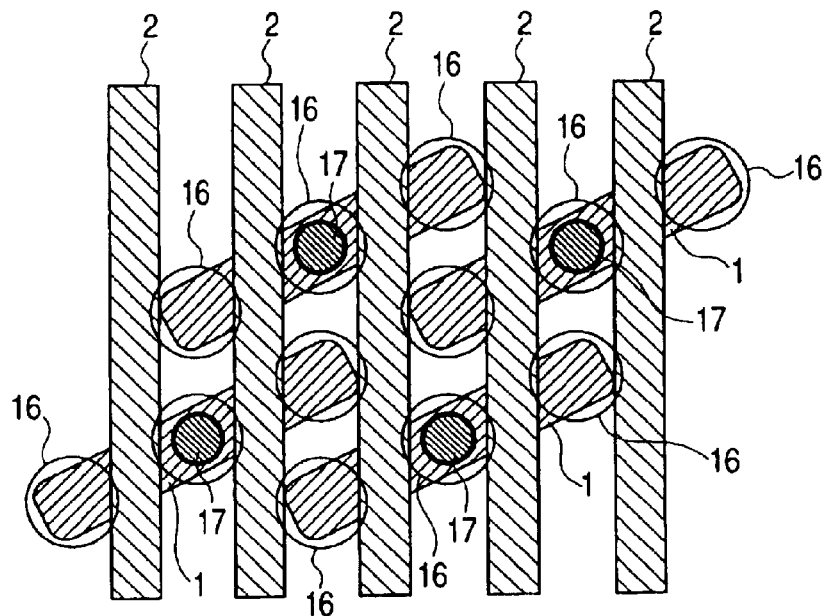
FIG. 16 is a typical layout of the components of the semiconductor storage device in one phase of the semiconductor storage device fabricating method according to the present invention.
Figure 17:
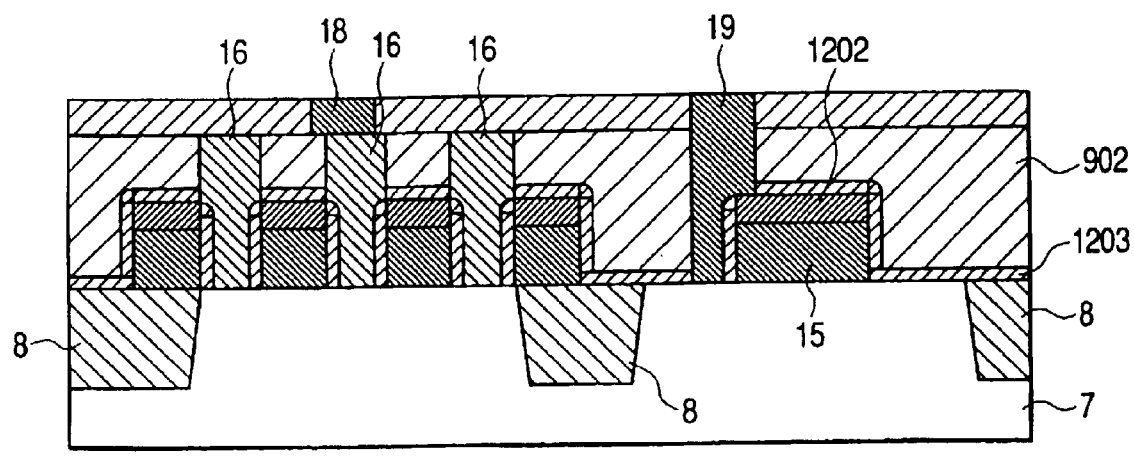
FIG. 17 is a typical sectional view of the workpiece in one phase of the semiconductor storage device fabricating method according to the present invention.

Subsequently, a 50 nm thick silicon oxide film 903 is deposited by a CVD method, and bit line contact holes of 0.18 μm in diameter in the memory cell array and contact holes for the peripheral circuits are formed as shown in FIG. 15. FIG. 16 shows the layout of bit line contacts 17. Then TiN plugs are formed. A 100 nm thick TiN film 18 is deposited by a CVD method, the TiN film is etched to form TiN plugs 18 and 19 as shown in FIG. 17. Plugs formed by processing a W/TiN two-layer film may be used instead of the TiN plugs.

Figure 18:
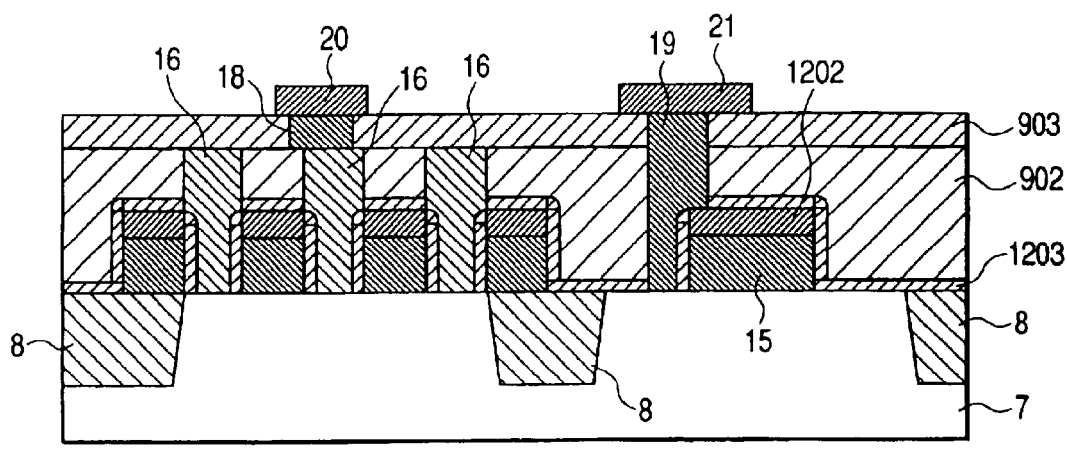
FIG. 18 is a typical sectional view of the workpiece in one phase of the semiconductor storage device fabricating method according to the present invention.
Figure 19:
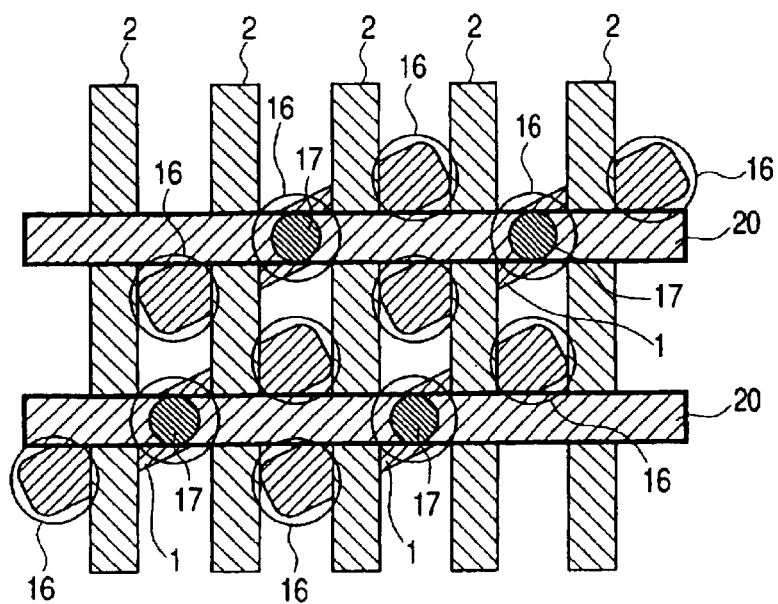
FIG. 19 is a typical layout of the components of the semiconductor storage device in one phase of the semiconductor storage device fabricating method according to the present invention.

A 50 nm thick tungsten film for forming bit lines is formed by a sputtering method. The tungsten film is subjected to dry etching using a resist mask to form bit lines 20 in a region corresponding to the memory cell array, and wiring lines 21 are formed in regions corresponding to the peripheral circuits as shown in FIG. 18. FIG. 19 shows the layout of the bit lines 20 for the memory cell array. The word lines are arranged at pitches 2F and the bit lines are arranged at pitches 3F, where F is the width of the word lines and the bit lines.

Figure 20:
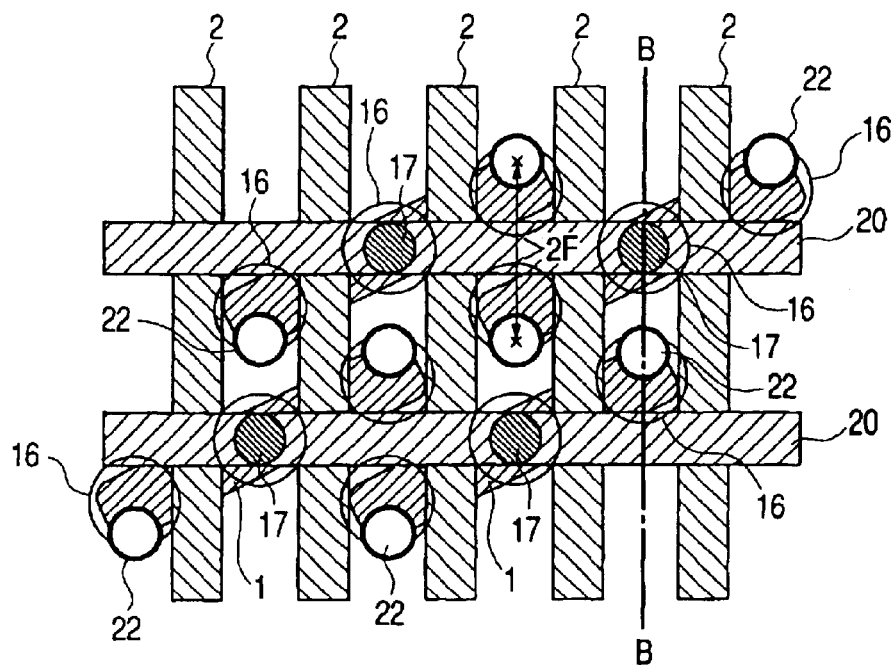
FIG. 20 is a typical layout of the components of the semiconductor storage device in one phase of the semiconductor storage device fabricating method according to the present invention.
Figure 21:
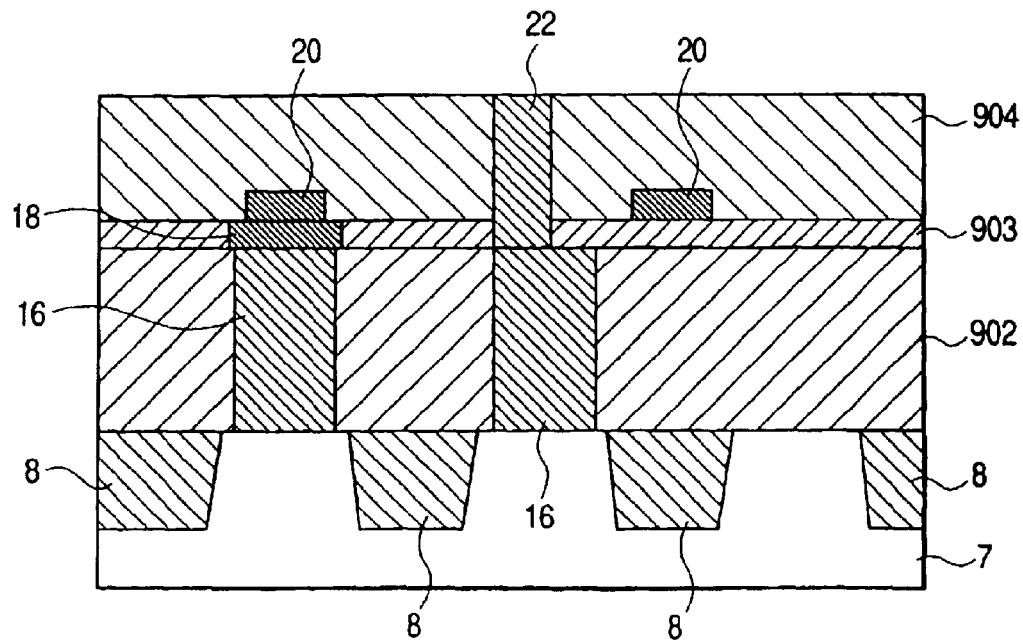
FIG. 21 is a typical sectional view of the workpiece in one phase of the semiconductor storage device fabricating method according to the present invention.

The bit lines are formed in a width of 80 nm by reducing the width by about 50 nm by resist ashing to avoid the interference of lower electrode contact holes with the bit lines when forming the lower electrode contact holes for the capacitors. A 200 nm thick oxide film 904 serving as an inter-layer insulating film is deposited and the surface of the oxide film 904 is planarized by etching. Then, upper electrode contacts for the capacitors are formed to form the contact without using a self-alignment process. As shown in FIG. 20, the centers of upper electrode contact plugs 22 are dislocated from positions corresponding to the centers of the lower electrode contact plugs in directions away from the bit lines, and the upper electrode contact plugs 22 are formed in a diameter smaller than that of the lower electrode contact plugs 16. The layout of memory cell contacts is characterized by the following. The center distance between the adjacent upper electrode contact plugs 22 with respect to a direction parallel to the word lines is greater than that of the lower electrode contact plugs 16. The center distance between the adjacent upper electrode contact plugs 22 with respect to a direction parallel to the bit lines is smaller than that of the adjacent lower electrode contact plugs 16. Therefore, the short circuit between the upper electrode contact plugs 22 and the bit lines can be prevented even if the upper electrode contact plugs 22 are formed without using the self-alignment technique. Since the lower electrode contact plugs 16 have a large diameter, the upper electrode contact plugs 22 are able to overlap the lower electrode contact plugs 16 satisfactorily even if the upper electrode contact plugs 22 are dislocated from positions corresponding to the corresponding lower electrode contact plugs 16. A 300 nm thick polycrystal silicon film having a high phosphorus concentration is deposited, the surface of the polycrystal silicon film is planarized by etching back process, the upper electrode contact plugs 22 are formed as shown in FIG. 21. FIG. 21 is a sectional view taken on line B—B in FIG. 20.

Figure 22:
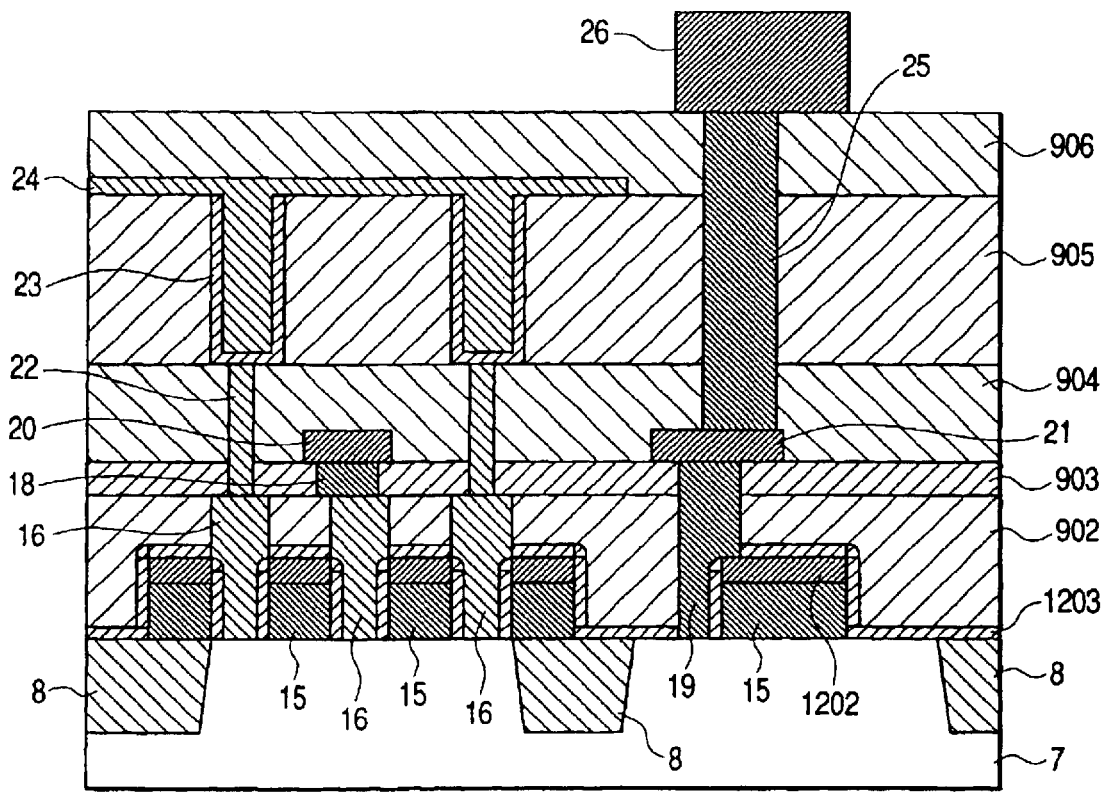
FIG. 22 is a typical sectional view of the workpiece in one phase of the semiconductor storage device fabricating method according to the present invention.

Then, memory capacitors 23 and wiring lines 2 (26) are formed by known methods to obtain a desired semiconductor storage device shown in FIG. 22. Naturally, additional wiring layers can be formed in the semiconductor storage device when necessary.

Since the upper electrode contact plugs are dislocated from positions corresponding to the lower electrode contact plugs and the upper electrode contact plugs have a diameter smaller than that of the lower electrode contact plugs, a DRAM of an open bit line structure can be fabricated without increasing the cell area and without using any self-alignment process. The first embodiment has another characteristic as follows. That is, it is very important for a DRAM of an open bit line structure to reduce parasitic resistance and capacitance in view of preventing the adverse effect of noise. In the first embodiment, the word lines are formed by processing a polysilicon-tungsten two-layer film and the bit lines are formed by processing a tungsten film. Therefore, the word lines and the bit lines have a low resistance and the DRAM is resistant to noise.

Second Embodiment

A semiconductor integrated circuit device fabricating method in a second embodiment according to the present invention is intended to fabricate a DRAM of an open bit line structure resistant to noise and having a small cell area. The semiconductor integrated circuit device fabricating method in the second embodiment has steps simpler than those of the semiconductor integrated circuit device fabricating method in the first embodiment and needs a less number of masks than the semiconductor integrated circuit device fabricating method in the first embodiment. Whereas the first embodiment forms stacked plugs as the lower electrode contact plugs, the second embodiment forms a single-layer plugs as the lower electrode contact plugs.

Figure 23:
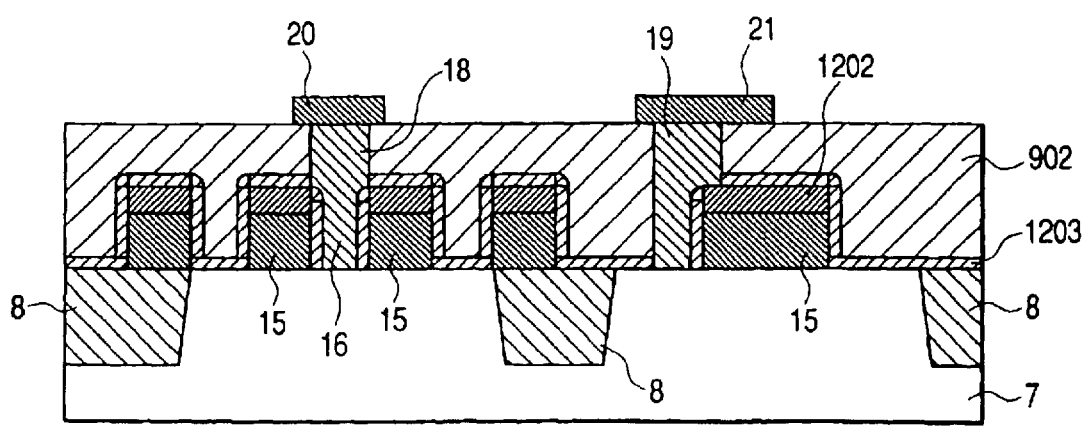
FIG. 23 is a typical-sectional view of the workpiece in one phase of the semiconductor storage device fabricating method according to the present invention.
Figure 24:
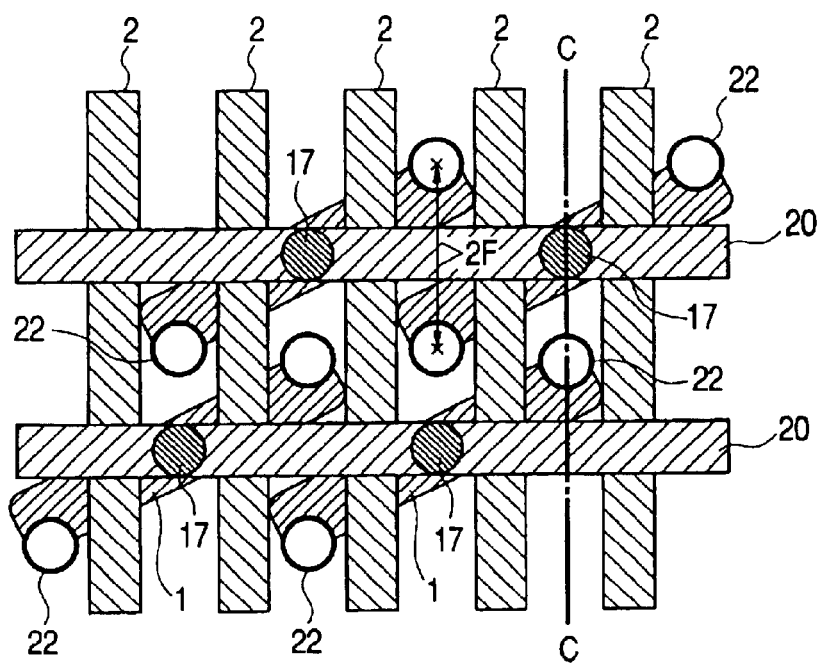
FIG. 24 is a typical layout of the components of the semiconductor storage device in one phase of the semiconductor storage device fabricating method according to the present invention.

Steps of the method in the second embodiment to the step of forming the word lines shown in FIG. 11 are the same as those of the first embodiment. An inter-layer insulating film 902 is deposited and bit line contact holes and peripheral circuit contact holes are formed. Contact plugs 18 and 19 are formed, bit lines 20 of tungsten and local wiring lines 21 of tungsten are formed as shown in FIG. 23. The bit lines 20 are narrowed in a width of about 80 nm as mentioned in the description of the first embodiment. A silicon oxide film 904, i.e., an inter-layer insulating film, is deposited and the surface thereof is planarized and capacitor electrode contact holes for capacitor electrode contact plugs 22 are formed as shown in FIG. 24. The capacitor electrode contact holes for the capacitor electrode contact plugs 22 are biased relative to underlying element forming regions in a direction to increase an allowance for preventing the interference of the capacitor electrode contact plugs with the bit lines. The capacitor electrode contact plugs are about 100 nm in diameter.

Figure 25:
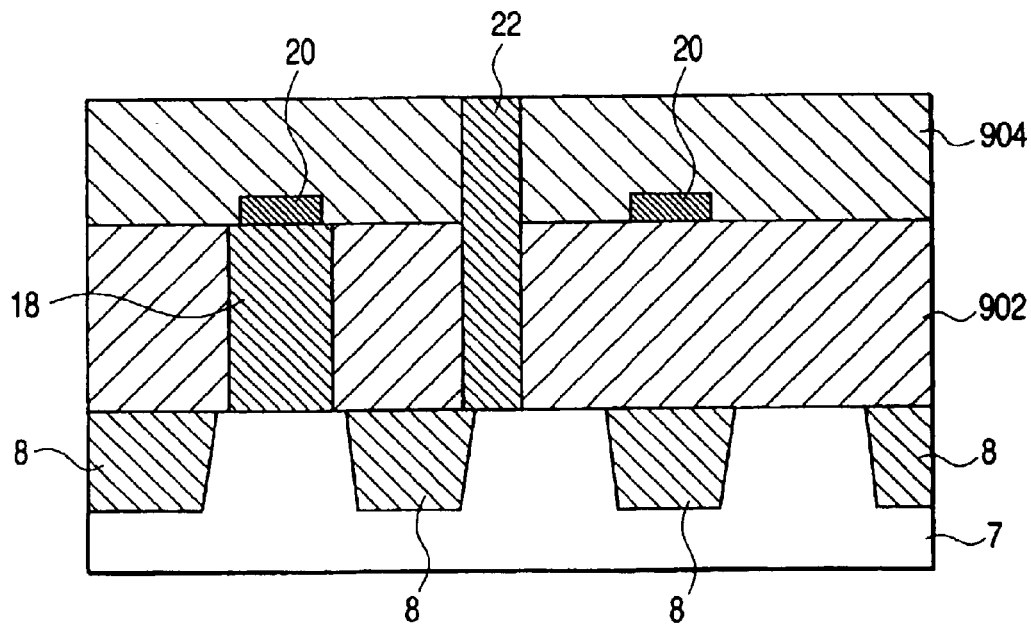
FIG. 25 is a typical sectional view of the workpiece in one phase of the semiconductor storage device fabricating method according to the present invention.

Thus, short circuit between the capacitor electrode contact plugs and the bit lines can be avoided without arranging the bit lines at great intervals. The electrode plugs 22 are formed in the capacitor lower electrode contact holes as shown in FIG. 25. Since a portion of the electrode plug 22 overlapping the element forming region is small, there is an anxiety that contact resistance is increased. However, measurement proved that contact resistance is not as large as the characteristic of the memory cells is degraded. The following steps of forming capacitors and wiring lines are the same as those of the first embodiment. Thus, a desired semiconductor storage device is fabricated.

The plugs interconnecting the capacitor lower electrodes and the active regions of the semiconductor substrate are formed by processing a single film, the plugs are biased away from the bit lines in the direction of the word lines, and the plugs are formed in 100 nm in diameter. Thus, the DRAM of an open bit line structure having a small bit line capacitance can be formed without using any self-alignment process and without increasing the cell area.

Third Embodiment

The third embodiment is intended to increase allowance around the memory cells of a DRAM of an open bit line structure.

Figure 26:
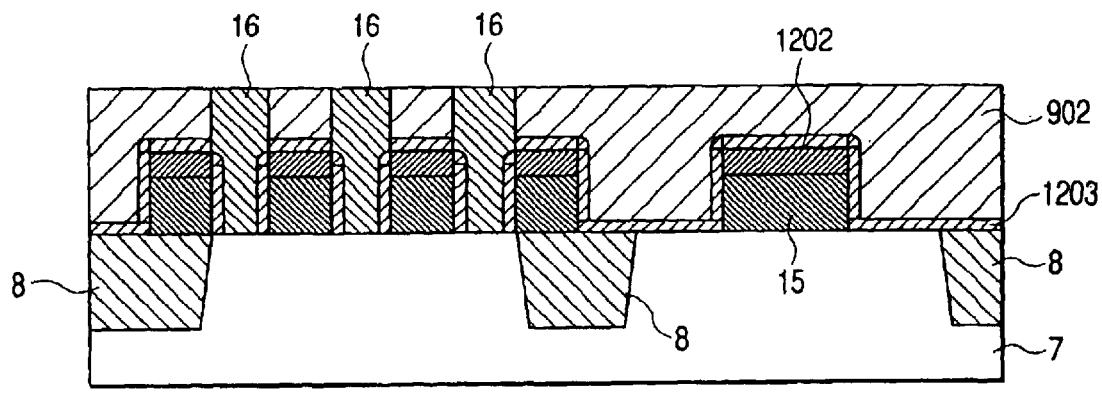
FIG. 26 is a typical sectional view of the workpiece in one phase of the semiconductor storage device fabricating method according to the present invention.
Figure 27:
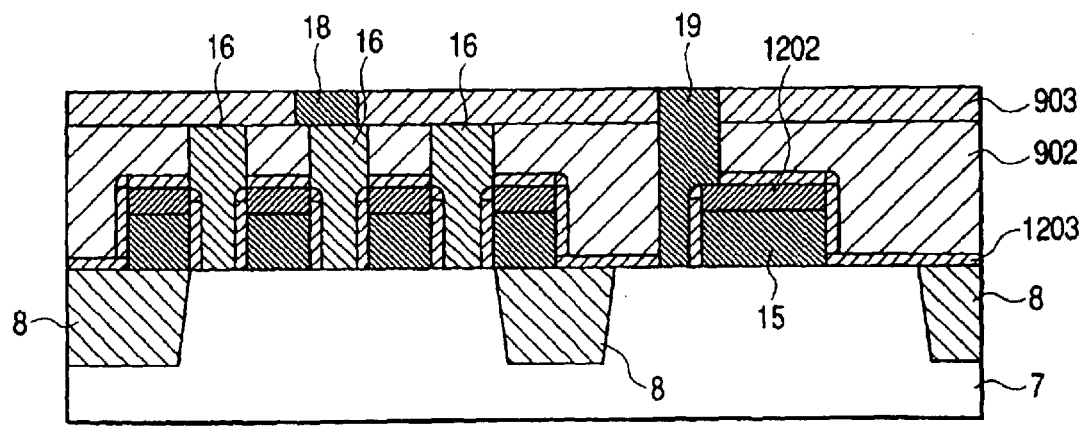
FIG. 27 is a typical sectional view of the workpiece in one phase of the semiconductor storage device fabricating method according to the present invention.
Figure 28:
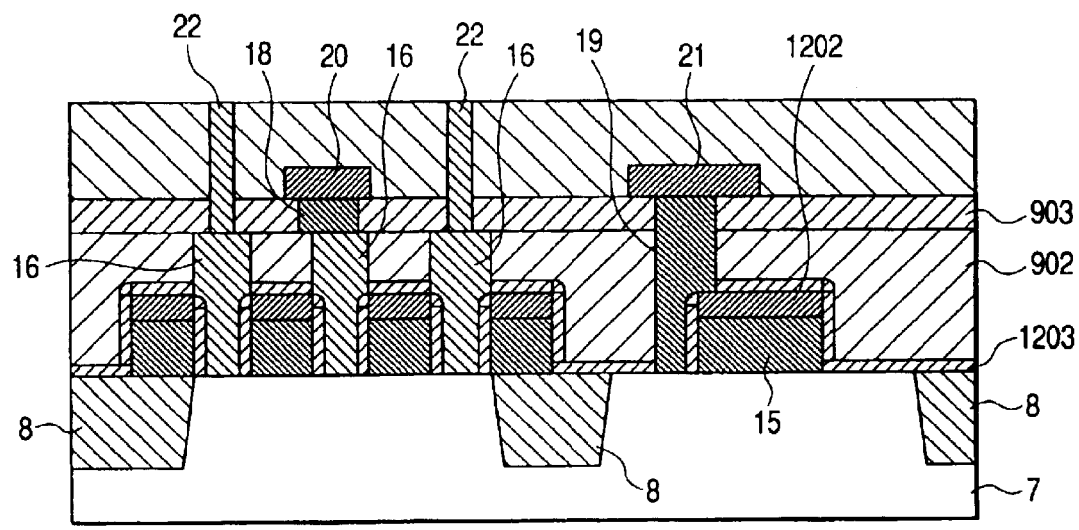
FIG. 28 is a typical sectional view of the workpiece in one phase of the semiconductor storage device fabricating method according to the present invention.
Figure 29:
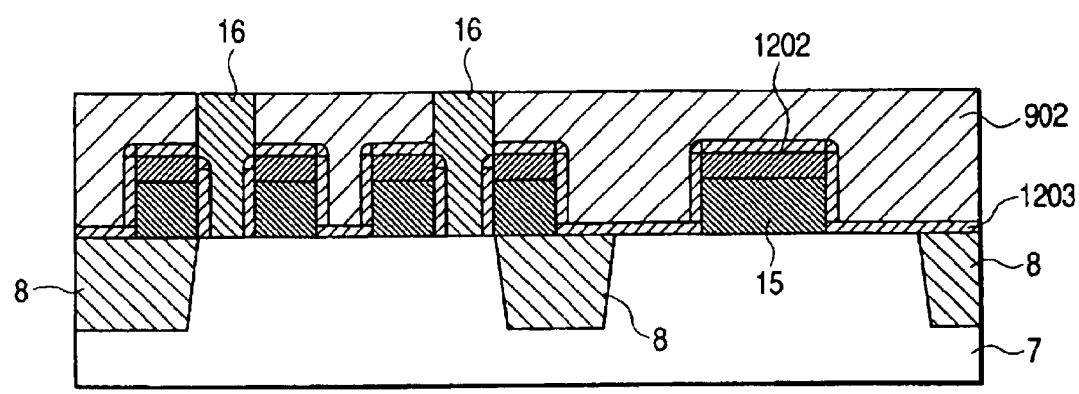
FIG. 29 is a typical sectional view of the workpiece in one phase of the semiconductor storage device fabricating method according to the present invention.
Figure 30:
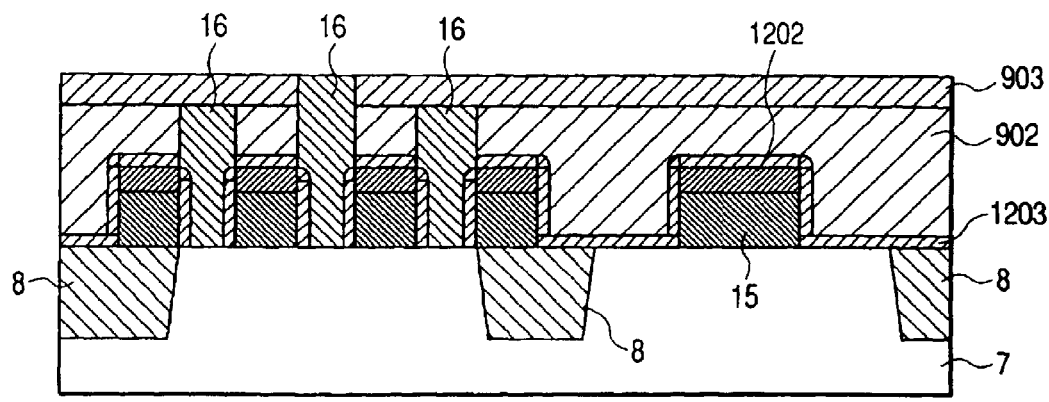
FIG. 30 is a typical sectional view of the workpiece in one phase of the semiconductor storage device fabricating method according to the present invention.
Figure 31:
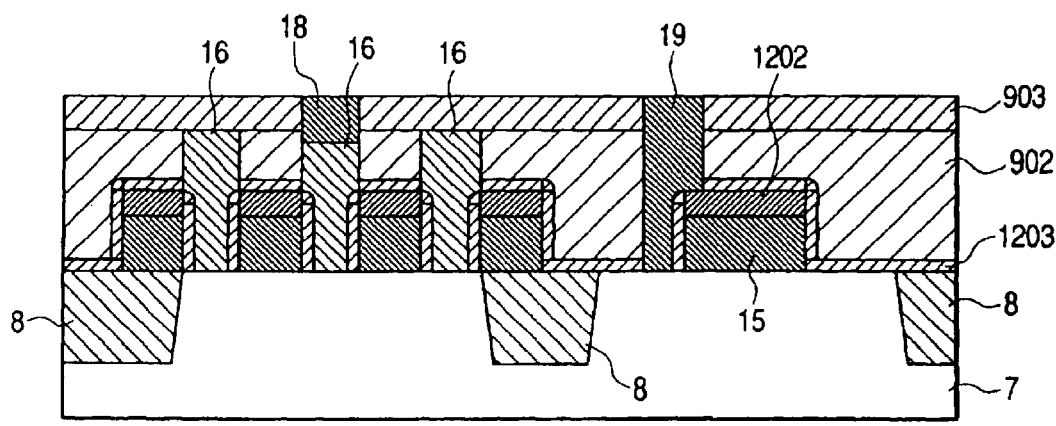
FIG. 31 is a typical sectional view of the workpiece in one phase of the semiconductor storage device fabricating method according to the present invention.
Figure 32:
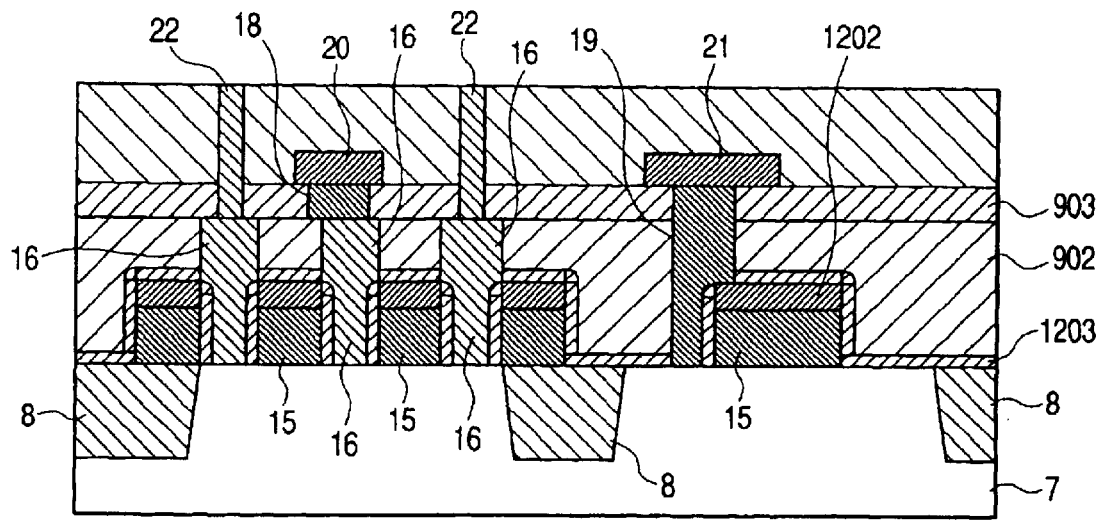
FIG. 32 is a typical sectional view of the workpiece in one phase of the semiconductor storage device fabricating method according to the present invention.

The first embodiment forms the memory cell plugs by the steps of forming the lower electrode contact plugs 16 of the bit lines and the capacitors (FIG. 26), forming bit line upper plugs 18 (FIG. 27), forming the bit lines 20 and upper electrode contact plugs 22 of the capacitors (FIG. 28). The third embodiment forms memory cell plugs by the following steps. Capacitor lower electrode contact plugs 16 of polycrystal silicon are formed as shown in FIG. 29. An inter-layer insulating film is deposited, bit line contact holes are formed and bit line plugs of polycrystal silicon are formed as shown in FIG. 30. Then, the bit line plugs are etched back to form a recess and W/TiN plugs 18 are formed on the bit line plugs as shown in FIG. 31. At the same time, peripheral circuit contact plugs 19 are formed. Subsequently, bit lines 20 of tungsten, capacitor upper electrode contact plugs 22 are formed as shown in FIG. 32. Although the third embodiment uses polycrystal silicon for connecting the plugs to diffused layer in view of simplifying processes, a metal, such as W/TiN may be used instead of polysilicon.

The third embodiment forms the bit line upper contact plugs 18 effectively so as to be aligned with the capacitor lower electrode contact plugs 16. Therefore, the third embodiment is able to secure an overlapping margin greater than that can be secured by the first embodiment in a memory cell plug forming process.

Fourth Embodiment

Figure 33:
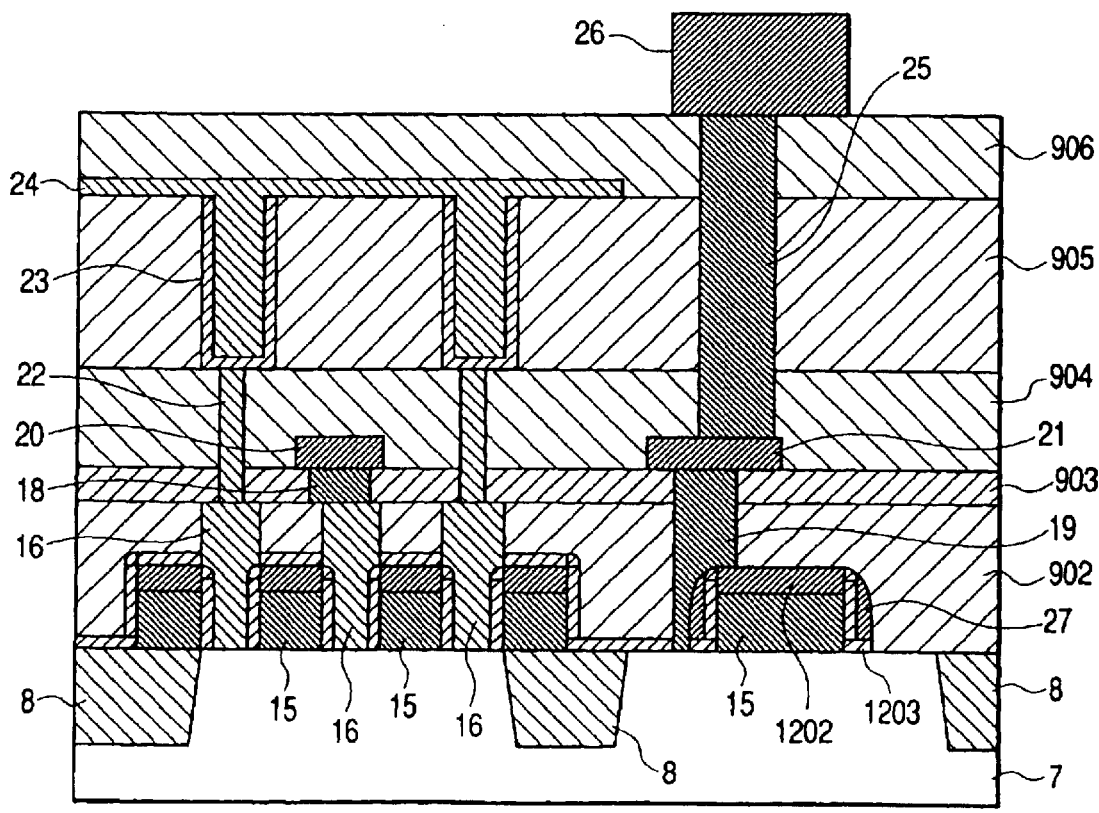
FIG. 33 is a typical sectional view of the workpiece in one phase of the semiconductor storage device fabricating method according to the present invention.

The fourth embodiment is intended to enhance the ability of the peripheral circuits of a DRAM of an open bit line structure. As mentioned in the description of the first embodiment, in a DRAM of 0.13 μm in feature size, the thickness of the film covering the side walls of the components of memory cells is limited to about 30 nm in view of securing contact area between memory cell plugs and the diffused layers. In view of simplifying processes, it is desirable to use the same film for covering the side walls of the components of peripheral circuits. However, to satisfy both the high ability and reliability of transistors, the thickness of the film covering the side walls must be about 100 nm. The fourth embodiment uses films different from each other in thickness for covering the side walls of the components of memory cell transistors and the side walls of components of peripheral circuit transistors, respectively. As shown in FIG. 33, the side walls of the components of the transistors of memory cells are coated with a 30 nm thick SiN film 1203, and the side walls of the components of the transistors of peripheral circuits are coated with a two-layer film consisting of the 30 nm thick SiN film 1203 and a 40 nm thick $SiO_2$ film 27.

The fourth embodiment coating the side walls of the components of the transistors of the peripheral circuits with the two-layer film thicker than that of the film coating the side walls of the components of the transistors of the memory cells copes with both high performance and reliability.

Fifth Embodiment

Figure 34A:
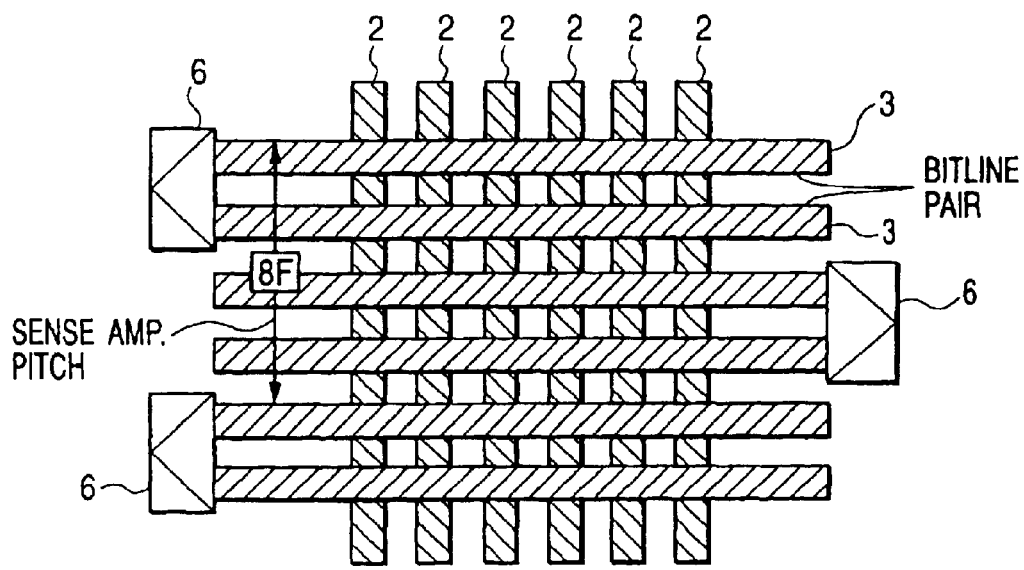
FIGS. 34(a) and 34(b) are typical layouts showing positions of sense amplifiers in a folded bit line structure and in an open bit line structure, respectively.
Figure 34B:
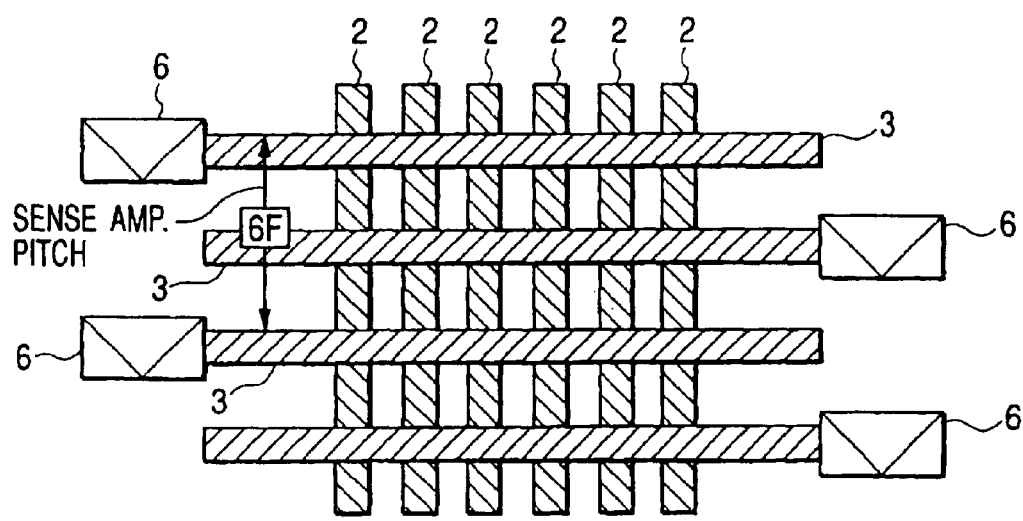
Figure 35A:
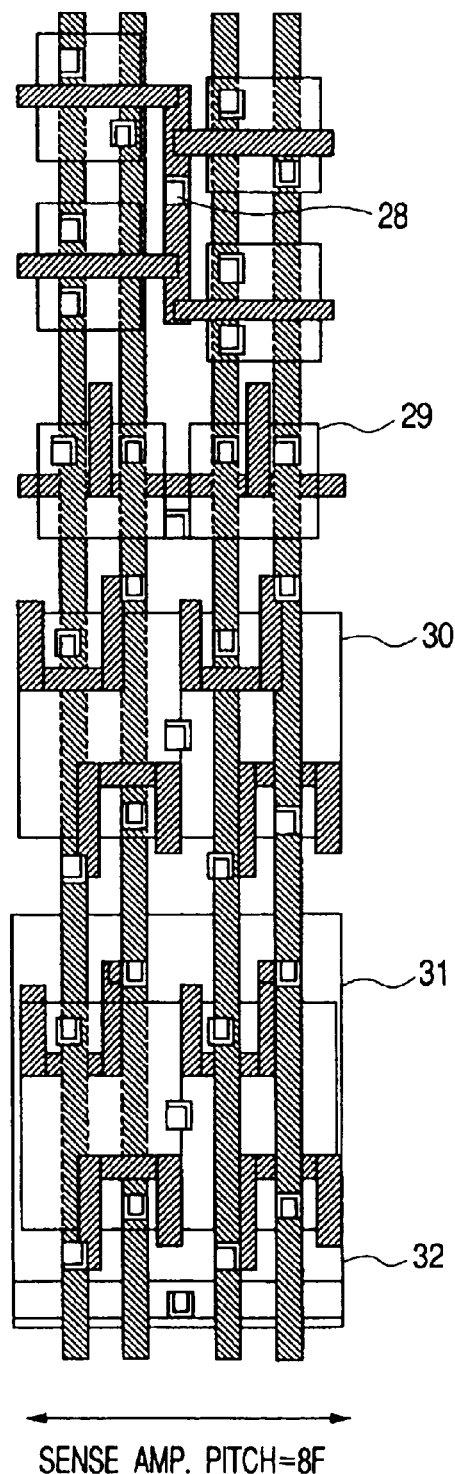
FIGS. 35(a) and 35(b) are typical layouts showing positions of sense amplifiers in a conventional semiconductor storage device and in a semiconductor storage device according to the present invention, respectively.
Figure 35B:
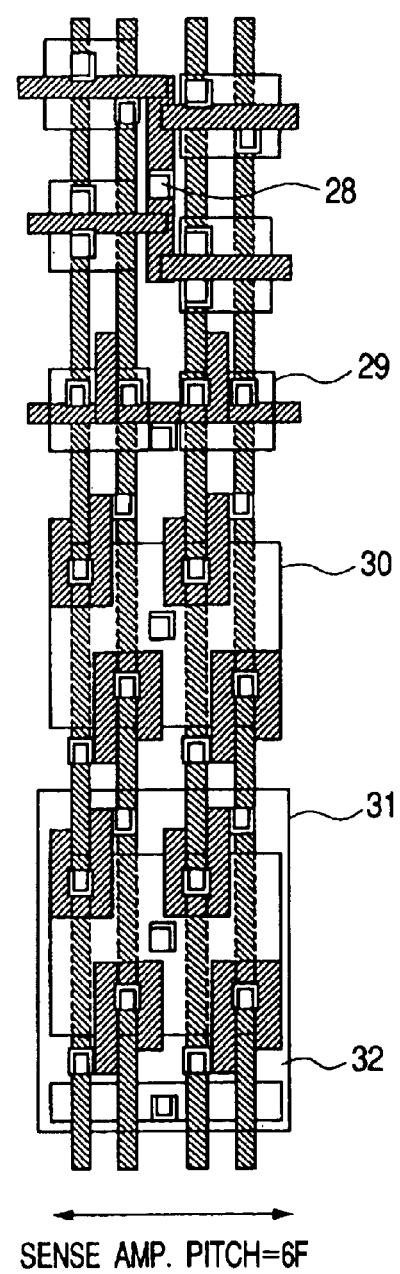

A fifth embodiment according to the present invention relates to the layout of sense amplifiers of a DRAM of an open bit line structure. In a conventional DRAM of a folded bit line structure, bit lines are arranged at pitches of 2F and sense amplifiers are arranged at pitches of 8F, where F is the width of bit lines, as shown in FIG. 34(a). In a DRAM of an open bit line structure, sense amplifiers must be arranged at pitches of 6F as shown in FIG. 34(b) to prevent increasing cell area; that is, the short sides of the sense amplifiers must be shortened. A self-alignment contact process capable of reducing the interval between a gate electrode and a contact is applied to the component transistor of a sense amplifier. FIG. 35(b) shows a layout for such a case. Consequently, sense amplifiers can be arranged at desired pitches.

The technically difficult self-alignment contact technique has not been used for forming sense amplifiers.

Thus, the fifth embodiment applies a self-alignment contact hole process with gates to forming sense amplifiers for a DRAM of an open bit line structure to arrange the sense amplifiers at pitches of 6F. Thus, a desired semiconductor storage device can be fabricated without increasing the pitches of bit lines.

Sixth Embodiment

Figure 36:
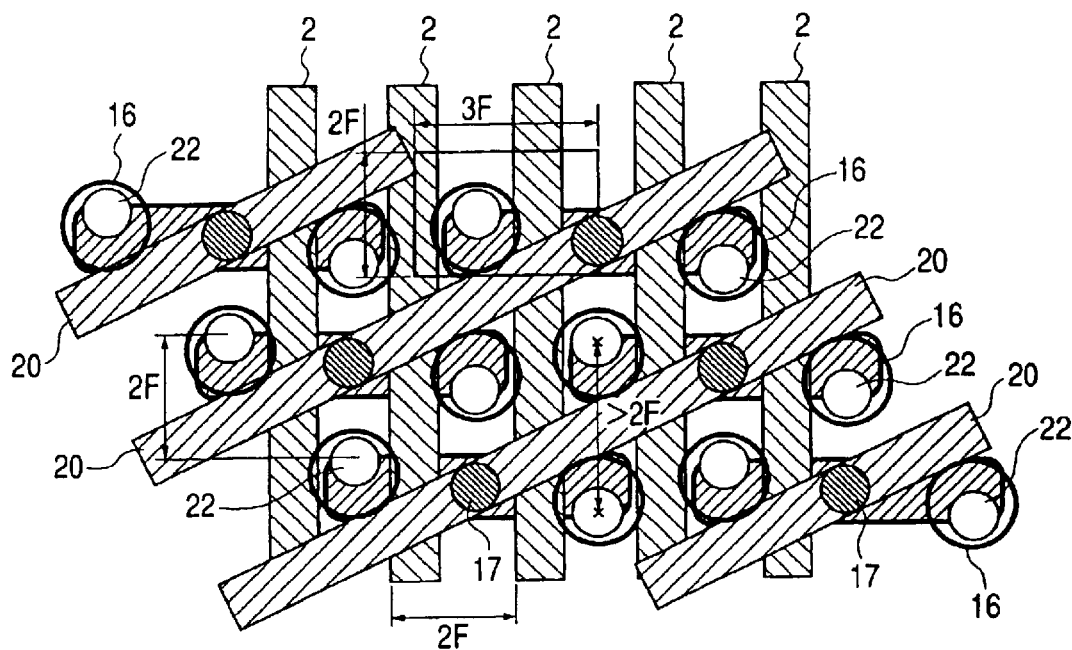
FIG. 36 is a layout of an memory array in a semiconductor storage device in a preferred embodiment according to the present invention.
Figure 37:
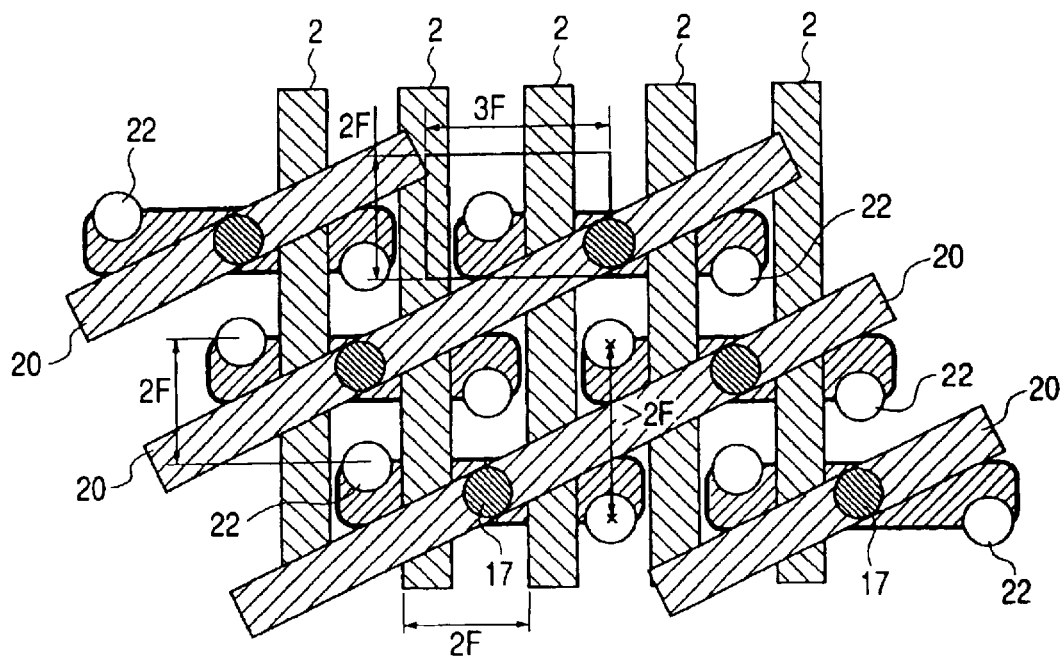
FIG. 37 is a layout of an memory array in a semiconductor storage device in a preferred embodiment according to the present invention.

A sixth embodiment according to the present invention relates to the layout of the memory cells of a DRAM of an open bit line structure. In the layouts of the components formed by the first and the second embodiment, the word lines are extended perpendicularly to the bit lines and the element forming regions are extended obliquely to the word lines and the bit lines. The sixth embodiment extends element forming regions perpendicularly to word lines, and extends bit lines obliquely to the bit lines and the element forming regions as shown in FIG. 36. Cell area is $6F^2$, where F is a feature size. A desired semiconductor storage device can be formed by the same steps as those of the first embodiment. FIG. 37 shows another layout of memory cells. In an arrangement shown in FIG. 36 plugs connected to capacitor lower electrodes are of a multilayer structure. In an arrangement shown in FIG. 37, plugs connected to capacitor lower electrodes are of a single-layer structure. In each of the layouts shown in FIGS. 36 and 37, the plugs connected to the capacitor lower electrodes are dislocated from positions corresponding to the center lines of the element forming regions in directions away from the bit lines. Thus, the semiconductor storage device of an open bit line structure resistant to noise can be formed without increasing the cell area. Intervals between the element forming regions are greater than those of the DRAMs formed by the first and the second embodiment and hence leakage between the memory cells can be suppressed.

As is apparent from the foregoing description, the present invention improves the noise resistance of DRAMs of an open bit line structure and reduces cell area.

What is claimed is:

1. A semiconductor integrated circuit device having a plurality of word lines extending in a first direction, a plurality of bit lines extending in a second direction intersecting the first direction, and a plurality of memory cells each including a transistor and a capacitor disposed on the bit lines, said semiconductor integrated circuit device comprising:

active regions formed on a semiconductor substrate, extending in a third direction different from the first and the second directions and each intersecting two of the word lines and one of the bit lines;

first and second semiconductor regions formed in the active regions and serving as sources and drains of the transistors;

first and second electrodes for forming the capacitors;

a dielectric film formed between the first and the second electrodes;

a first insulating film formed between the bit lines and the first electrodes; and a first conducting layer having portions formed in first openings formed in the first insulating film and electrically connecting either of the first and the second semiconductor regions to the first electrodes;

wherein portions of the first conducting layer are arranged in regions surrounded by the word lines and the bit lines, respectively, the portions of the first conducting layer have a width in the second direction smaller than that of the word lines, and a center of the portions of the first conducting layer is placed off of a center line of said active regions directed in the third direction.

2. The semiconductor integrated circuit device according to claim 1, wherein a width of the bit lines is smaller than that of the word lines.

3. The semiconductor integrated circuit device according to claim 1, further comprising a second conducting layer formed between the first conducting layer and either of the first and the second semiconductor regions, wherein a width with respect to the first direction of portions of the second conducting layer is greater than that of the portions of the first conducting layer.

4. The semiconductor integrated circuit device according to 3, wherein a center distance with respect to the first direction between adjacent portions of the second conducting layer is smaller than that between adjacent portions of the first conducting layer overlying the second conducting layer.

5. The semiconductor integrated circuit device according to claim 3, wherein a center distance with respect to the second direction between adjacent portions of the second conducting layer is greater than that between adjacent portions of the first conducting layer overlying the second conducting layer.

6. The semiconductor integrated circuit device according to claim 3, wherein a silicon nitride film is formed between the word lines and the second conducting layer, and no silicon nitride film is formed between the bit lines and the first conducting layer.

* * * * *